United States Patent [19]
Schussler et al.

[11] 3,974,405
[45] Aug. 10, 1976

[54] PIEZOELECTRIC RESONATORS

[75] Inventors: Hans Schussler, Ulm (Danube); Gerhard Kohlbacher, Ulm-Wiblingen (Danube), both of Germany

[73] Assignee: Licentia Patent-Verwaltungs-B.m.b.H., Frankfurt, Germany

[22] Filed: Mar. 12, 1973

[21] Appl. No.: 340,375

Related U.S. Application Data

[63] Continuation of Ser. No. 50,608, June 29, 1970.

[30] Foreign Application Priority Data
June 28, 1969 Germany............................ 1932911

[52] U.S. Cl.................................. 310/9.8; 310/8.2; 333/72
[51] Int. Cl.²........................................ H01L 41/04
[58] Field of Search................ 310/8.2, 9.7, 9.8, 8.1; 333/72

[56] References Cited
UNITED STATES PATENTS

| 3,334,307 | 8/1967 | Blum................................ 310/9.8 X |
| 3,544,926 | 12/1970 | Hurtig.................................... 333/72 |
| 3,576,453 | 4/1971 | Mason............................ 310/9.8 X |
| 3,576,506 | 4/1971 | Reynolds et al....................... 333/72 |
| 3,602,844 | 8/1971 | Sykes................................. 333/72 X |

*Primary Examiner*—Mark O. Budd
*Attorney, Agent, or Firm*—Spencer & Kaye

[57] ABSTRACT

To reduce the capacitive coupling between the input and output transducers of a piezoelectric resonator arrangement having a one-piece construction, one or a plurality of coatings disposed between the two transducers, which coatings serve for defining given resonators, are connected to ground on either one or both sides and, if required, one coating of the input and output transducers is also connected to ground.

3 Claims, 6 Drawing Figures

Inventors.
Hans Schüssler
Gerhard Kohlbacher
BY Spencer & Kaye
ATTORNEYS.

PIEZOELECTRIC RESONATORS

CROSS REFERENCE TO RELATED APPLICATIONS

This application is a continuation of application Ser. No. 50,608, filed June 29th, 1970.

BACKGROUND OF THE INVENTION

The present invention relates to a piezoelectric resonator arrangement, and particularly to an arrangement constructed as a one-piece unit.

Such resonator arrangements generally consist of a plate-shaped vibrating crystal or piezoceramic to the input and output sides of which are applied coatings for the input and output transducers as well as coatings disposed therebetween on both sides to define the given resonators.

In constructing such resonator arrangements it is particularly desirable to be able to electrically decouple the output and input transducers from one another. The conventional input capacitances of the transducers of such resonator arrangements, or filters, are of the order of magnitude of a few pF and particular care must therefore be taken that the coupling capacitance between the coatings of the input and output transducers remain below about 1 mpF because otherwise sufficient stop band attenuation can not be expected. For example, to achieve a selectivity of an overcoupling capacitance lower than 0.2 to 0.3 mpF would have to be maintained.

SUMMARY OF THE INVENTION

It is a primary object of the present invention to reduce such overcoupling capacitance.

A more specific object of the invention is to reduce the coupling capacitance between the input and output transducers of an arrangement of the type under consideration in a simple and inexpensive manner.

Since in the resonator arrangements here under consideration electrodes must be applied for each of the resonators disposed between the input and output transducers and external leads must be provided for the fabrication process, the possibility results to utilize these available electrodes for shielding purposes.

The present invention is based on the realization of this possibility and achieves, for a piezoelectric resonator arrangement of one-piece design, a reduction in the capacitive coupling between input and output transducers by grounding one or a plurality of coatings disposed between the input and output transducers on one or both sides, and possibly one coating of the input and output transducers.

There are several possible embodiments of the present invention. It would be possible, for example, to connect all the coatings of the resonators disposed between the transducers to one another and to ground. As a consequence there would then exist the requirement to establish coincidence between the inherent resonance of the transducers and the resonators therebetween. The only noticeable interference effect would then be a small component of the electrical field starting from the "hot," or active, transducer electrode and extending to the grounded coatings of the resonator adjacent the transducer. If sufficient spacing were provided for the individual resonators compared to the plate thickness, this interfering effect would be negligible. The desired ratio is about 1:10.

One advantage of this embodiment of the invention is that it permits a certain influence to be exerted on the resulting vibration characteristic by giving the arrangement a certain asymmetry which could result in a certain improvement in the distribution of the spurious resonances.

A further embodiment of the invention involves producing an electric no-load operation for all of the resonators disposed between the transducers while simultaneously grounding one side of the coating of each of the resonators at one side of the assembly. In this embodiment slightly different conditions would result for the interfering field.

Finally, multiple combinations of the short-circuited or no-load resonators with appropriate grounding are also possible.

DESCRIPTION OF THE PREFERRED EMBODIMENTS

Figure 1:
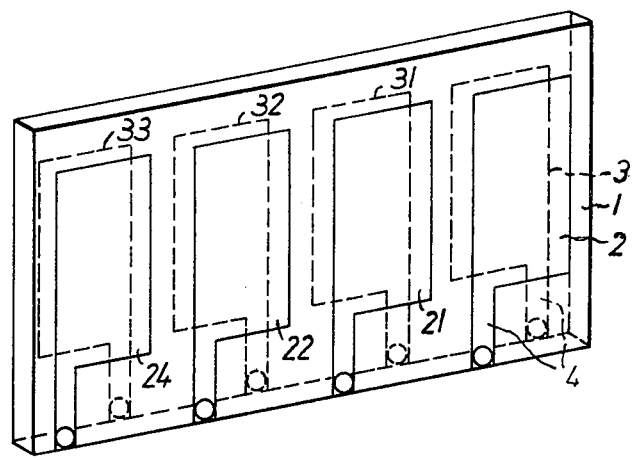
FIG. 1 is a perspective view of a filter arrangement of the type with which the invention is concerned.

FIG. 1 is a perspective view of an arrangement of a filter composed of four resonators formed on a plate-shaped vibrating crystal 1 to whose two opposite surfaces coatings 2 and 3, 21 and 31, 22 and 32, 23 and 33, respectively, are applied. These coatings present connections 4 through which the individual coatings can be connected with one another and, if required, to ground. In an example of the arrangement of FIG. 1, the coatings consist of silver, each coating having a length of 4.2 mm and a width of 2.2 mm; the thickness is chosen so as to achieve exactly the desired resonant frequency. The crystal 1 has the dimensions 14.5 × 14.5 mm with a thickness of 154 $\mu$m and a resonant frequency of 10.7 MHz, the crystal consists of quartz.

Figure 2:
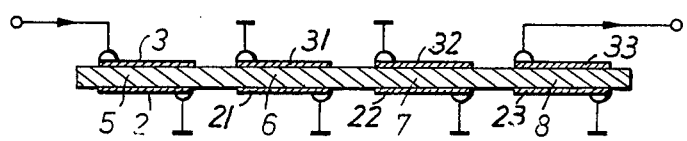
FIGS. 2–6 are elevational cross-sectional views of several embodiments of the invention.
Figure 6:
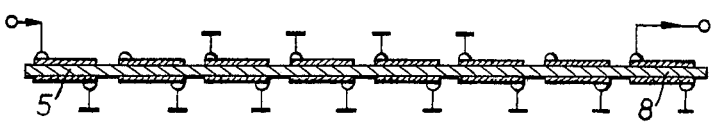

FIGS. 2 and 6 are side views of different embodiments of the present invention in which the crystal 1 can be seen as well as the coatings applied to both sides of this crystal. The two outermost resonators 5 and 8 represent the transducers via which the electrical energy is converted into mechanical energy and then back again into electrical energy. Appropriate coatings define resonators 6 and 7 which are disposed between the two transducers 5 and 8 and which are mechanically coupled with the transducers.

In the embodiment according to FIG. 2 both coatings of resonators 6 and 7 are connected to ground. The coating 2 of each transducer 5 and 8 at one side of the plate is also connected to ground on one side.

Figure 3:
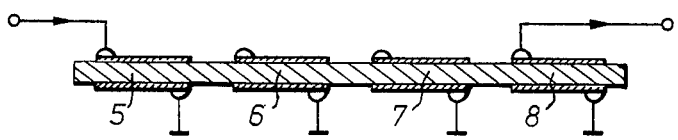

In the embodiment according to FIG. 3, which is similar to the embodiment of FIG. 2, only one coating of each resonator 6 and 7 is connected to ground, this being the coating 2 of each resonator.

Figure 4:
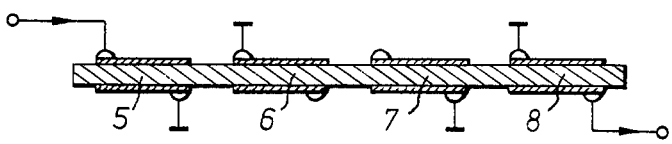

The embodiment of FIG. 4 differs from the preceding embodiment in that the coating of each transducer and resonator connected to ground is on the opposite side of the plate from the grounded coating of its adjacent resonators.

Figure 5:
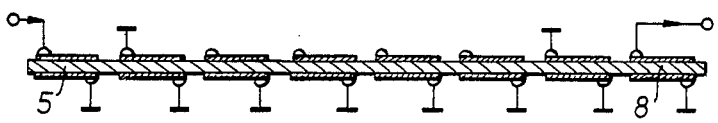

Whereas in the embodiments according to FIGS. 2 through 4 a total of four resonators are provided each of the embodiments of FIGS. 5 and 6 has a total of eight resonators of which the two outermost resonators 5 and 8 are again connected as transducers. In the embodiment of FIG. 5, the resonators immediately adjacent transducers 5 and 8 have both coatings grounded while the remaining resonators each have only one coating grounded, all of the grounded coatings being on the same side of the plate. In FIG. 6, the resonators adjacent transducers 5 and 8 have one side grounded and the remaining resonators have both sides grounded.

Although these embodiments were described in connection with a plate-shaped vibrating crystal, the features described can be transferred without difficulties to filters constructed of a plate-shaped piezoceramic. In the arrangement of FIG. 1, there exist many capacitances, for example between coatings 2 and 31, 31 and 32, 32 and 33, 3 and 32, 3 and 33, and capacitances between each coating and ground. It is not possible to eliminate the coupling effect of the capacitance between 3 and 33 (3 and 33 being the input and output terminal respectively) in the arrangement of FIG. 2, which is the same as shown in FIG. 1, but it is possible to eliminate the coupling effect between 3 and 33 of other capacitances by connecting to ground other coatings. In the arrangement of FIG. 2, there are all other coatings (all but 2 and 33) connected to ground, this results in the fact, that only the capacitance between 3 and 33 effects a coupling between these coatings.

This fact can easily be understood by means of a drawing, which shows the capacitances between the coatings and between each coating and ground in the manner of an electrical circuit, and in which the connecting to ground, as shown in FIG. 2, are drawn in.

The coupling capacitances are very small and therefore they can hardly be measured. The arrangement of FIG. 2, however allows to achieve a stop band attenuation of about 100 dB, whereas the arrangement of FIG. 1 allows only a stop band attenuation of about 90 dB.

The arrangements of FIG. 3 – 6 allow a stop band attenuation of about 93 dB or more.

It will be understood that the above description of the present invention is susceptible to various modifications, changes and adaptations, and the same are intended to be comprehended within the meaning and range of equivalents of the appended claims.

We claim:
1. In a completed piezoelectric resonator arrangement of one-piece construction prepared for connection between a signal source and a load and composed of a plate-shaped vibratory material to which coatings are applied on both sides, a pair of such coatings being applied at each of its input and output ends to define input and output transducers, and pairs of such coatings being applied between such ends to define resonators, with a signal input terminal being connected to one of the coatings of the input transducer and a signal output terminal being connected to one of the coatings of the output transducer, the improvement wherein in order to reduce the capacitive coupling between the input and output transducers, both coatings of at least one resonator are connected to ground, at least one but less than all of the remaining coatings disposed between the input and output transducers, and defining resonators, is connected to ground, and those of the remaining coatings which are not connected to ground are also electrically isolated from said input and output terminals.

2. An arrangement as defined in claim 1 wherein the other coating of each transducer is also connected to ground.

3. Piezoelectric resonator arrangement as defined in claim 2 wherein the coatings which are connected to ground are electrically connected together.

* * * * *